US009250027B2

(12) United States Patent
Hsieh

(10) Patent No.: US 9,250,027 B2
(45) Date of Patent: Feb. 2, 2016

(54) THERMAL MANAGEMENT STRUCTURES FOR OPTOELECTRONIC SYSTEMS

(71) Applicant: FINISAR CORPORATION, Sunnyvale, CA (US)

(72) Inventor: Cindy H. Hsieh, Los Altos, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 323 days.

(21) Appl. No.: 13/874,960

(22) Filed: May 1, 2013

(65) Prior Publication Data

US 2014/0329405 A1 Nov. 6, 2014

(51) Int. Cl.
| H05K 7/20 | (2006.01) |
| F28F 9/00 | (2006.01) |
| H05K 1/02 | (2006.01) |
| G02B 6/42 | (2006.01) |
| H01R 13/66 | (2006.01) |
| H05K 1/14 | (2006.01) |

(52) U.S. Cl.
CPC .............. *F28F 9/001* (2013.01); *G02B 6/4272* (2013.01); *H05K 1/0203* (2013.01); *H05K 1/0209* (2013.01); *H01R 13/6658* (2013.01); *H05K 1/144* (2013.01); *H05K 2201/042* (2013.01)

(58) Field of Classification Search
CPC ..... F28F 9/001; G02B 6/4272; H05K 1/0203; H05K 1/0209; H05K 7/20; H05K 1/144; H05K 2201/042; H01R 13/6658
USPC ........ 361/679.46–679.54, 688–723; 165/185; 439/485, 487
See application file for complete search history.

(56) References Cited

U.S. PATENT DOCUMENTS

| 2004/0062491 A1* | 4/2004 | Sato et al. ........................ 385/88 |
| 2006/0133042 A1* | 6/2006 | Belady et al. .................. 361/704 |
| 2008/0285236 A1 | 11/2008 | Phillips et al. |
| 2011/0031379 A1* | 2/2011 | Ishigami et al. .............. 250/216 |
| 2011/0235978 A1* | 9/2011 | Richardson et al. ............ 385/77 |
| 2012/0082420 A1 | 4/2012 | Aoki |

FOREIGN PATENT DOCUMENTS

WO 2012/036055 A1 3/2012

OTHER PUBLICATIONS

International Search Report Written and Opinion of the International Searching Authority dated Jan. 12, 2015 as received in Application No. PCT/US2014/036438 (10 pgs.).

* cited by examiner

*Primary Examiner* — Anthony Haughton
*Assistant Examiner* — Yahya Ahmad
(74) *Attorney, Agent, or Firm* — Maschoff Brennan

(57) ABSTRACT

An example embodiment includes a thermal management system for an active cable connector. The system includes a shell and a back plate. The shell defines a cavity and includes multiple heat-transfer areas on an internal shell surface. A first heat-transfer area is positioned with respect to a first heat-generating component to absorb a first portion of thermal energy generated by the first heat-generating component. The back plate is positioned with respect to the first heat-generating component to absorb a second portion of the thermal energy generated by the first heat-generating component. The back plate is further positioned proximate to a second heat-transfer area to transfer the second portion of the thermal energy to the shell.

19 Claims, 7 Drawing Sheets

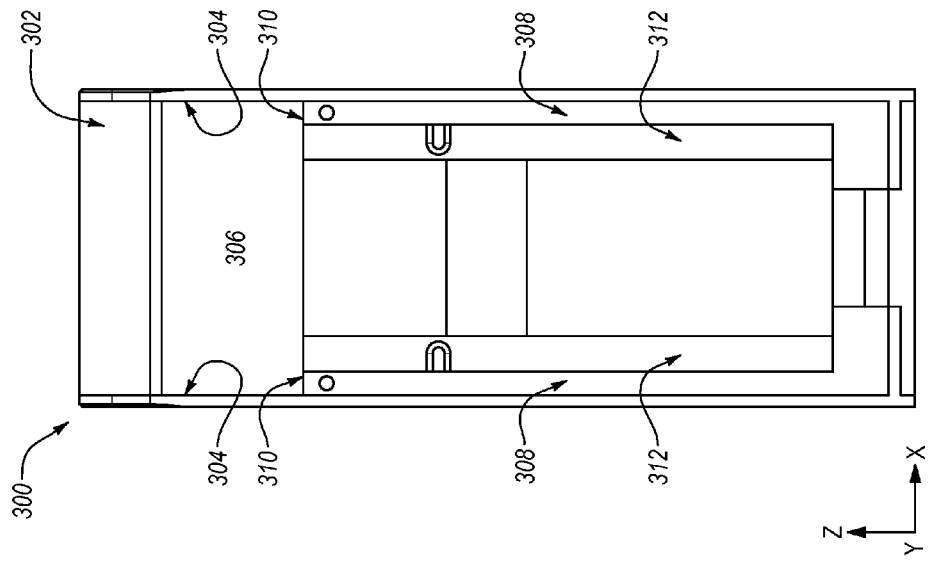
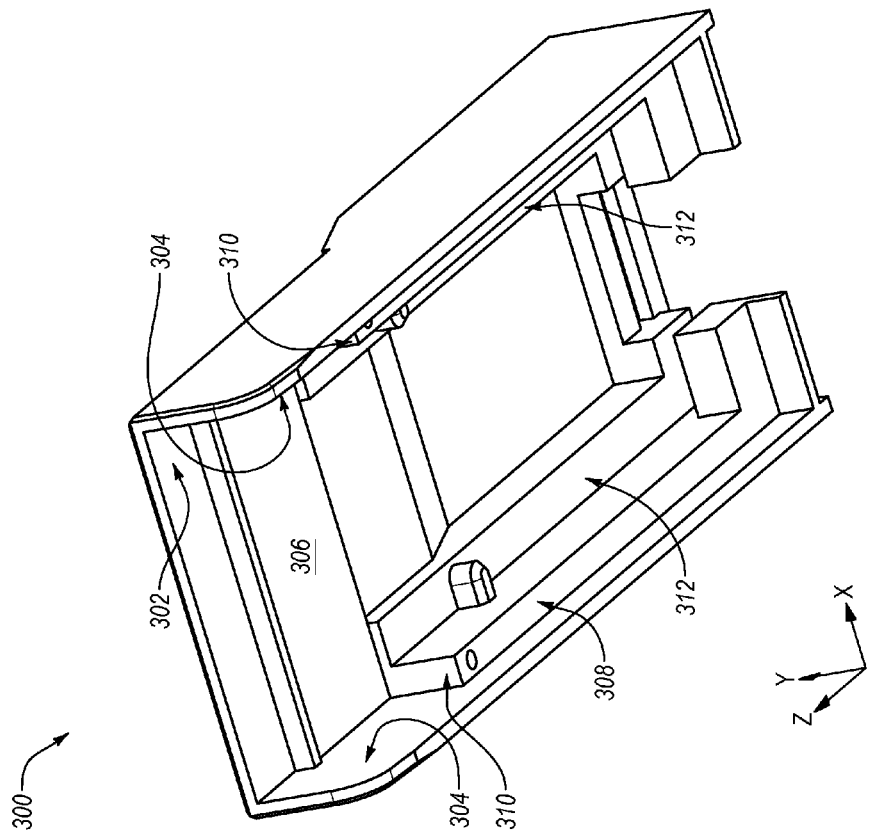

THERMAL MANAGEMENT STRUCTURES FOR OPTOELECTRONIC SYSTEMS

BACKGROUND

1. Field

Some embodiments discussed herein are related to components used in communication networks. In particular, some example embodiments relate to thermal management in active cable connectors.

2. Related Technology

Some data transmission in communication networks involves the conversion of optical signals to electrical signals and/or electrical signals to optical signals. In some applications, the conversion occurs at active cable connectors. For example, the active cable connectors may include one or more opto-electronic components that perform conversions between the optical and electrical domains. Additionally, in the active cable connectors, data signals, electrical or optical, may be processed or otherwise modified.

The conversion between optical and electrical domains and/or the processing of the data signals may generate heat. In some circumstances, the heat generated may cause problems with proper function of the components involved in conversion or the data signal processing. Additionally, excess heat may shorten the life or cause failure of components involved in the conversion or the data signal processing. Moreover, the heat may leak to surrounding components and cause similar problems.

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below. This Summary is not intended to identify key features or characteristics of the claimed subject matter, nor is it intended to be used as an aid in determining the scope of the claimed subject matter.

An example embodiment includes a thermal management system for an active cable connector. The system includes a shell and a back plate. The shell defines a cavity and includes multiple heat-transfer areas on an internal shell surface. A first heat-transfer area is positioned with respect to a first heat-generating component to absorb a first portion of thermal energy generated by the first heat-generating component. The back plate is positioned with respect to the first heat-generating component to absorb a second portion of the thermal energy generated by the first heat-generating component. The back plate is further positioned proximate to a second heat-transfer area to transfer the second portion of the thermal energy to the shell.

Another example embodiment includes a thermal management system. The thermal management system includes a top shell, a bottom shell, a first thermal pad, a back plate, and a second thermal pad. The top shell includes a top heat-transfer area and side heat-transfer areas. The bottom shell includes a bottom heat-transfer area. The first thermal pad is positioned to contact the top heat-transfer area, the first thermal pad being configured to transfer thermal energy from a first subset of heat-generating components to the top heat-transfer area. The back plate includes a top surface, two side surfaces, and a bottom surface. The back plate is positioned such that the top surface absorbs thermal energy generated by the first subset of heat-generating components and the two side surfaces are positioned proximate to the side heat-transfer areas. The second thermal pad is positioned to contact the bottom surface of the back plate and configured to transfer thermal energy from a second subset of heat-generating components to the back plate.

Another example embodiment includes an active cable connector. The active cable connector includes a shell, a first subset of heat-generating components, a second subset of heat-generating components, and a back plate. The shell defines a cavity. The shell includes multiple heat-transfer areas arranged on an internal shell surface and a heat-dissipation area on an external shell surface. The first subset of heat-generating components is mounted to a first printed circuit board (PCB). The first PCB includes a first PCB width. The second subset of heat-generating components is mounted to a second PCB. The second PCB includes a second PCB width, which is greater than the first PCB width. A first mounting surface of the first PCB and a second mounting surface of the second PCB are oriented in a common direction. The back plate is positioned between the first PCB and the second PCB. The back plate is further positioned to absorb at least a portion of thermal energy generated by the first subset of heat-generating components and the second subset of heat-generating components and to dissipate the portion of the thermal energy to one or more of the heat-transfer areas.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 3A and 3B illustrate an example embodiment of a top shell that may be included in the thermal management system of FIG. 1B;

DESCRIPTION OF SOME EXAMPLE EMBODIMENTS

An example embodiment includes an active cable connector. The active cable connector includes a first subset of heat-generating components mounted to a first printed circuit board (PCB), a second subset of heat-generating components mounted to a second PCB, and a thermal management system. The thermal management system includes a first thermal pad, back plate, a second thermal pad, and a shell. The shell defines a cavity in which the first PCB and the second PCB are positioned. The back plate is positioned between the first PCB and the second PCB.

The first subset of heat-generating components transfers thermal energy to the first thermal pad and to the shell. The second subset of heat-generating components transfers thermal energy to the second thermal pad and to the back plate. The back plate is positioned proximate to the shell and transfers the thermal energy to the shell. The thermal energy is then dissipated from the shell to a surrounding environment. The first PCB contacts a first PCB heat-transfer area of the shell and the second PCB contacts a second PCB heat-transfer area of the shell. Thermal energy is transferred from the first PCB to the shell at the first PCB heat-transfer area. In addition, thermal energy is transferred from the second PCB to the shell at the second PCB heat-transfer area.

Reference will now be made to the figures wherein like structures will be provided with like reference designations. It is understood that the figures are diagrammatic and schematic representations of some embodiments and are not limiting of the present invention, nor are they necessarily drawn to scale.

Figure 1A:
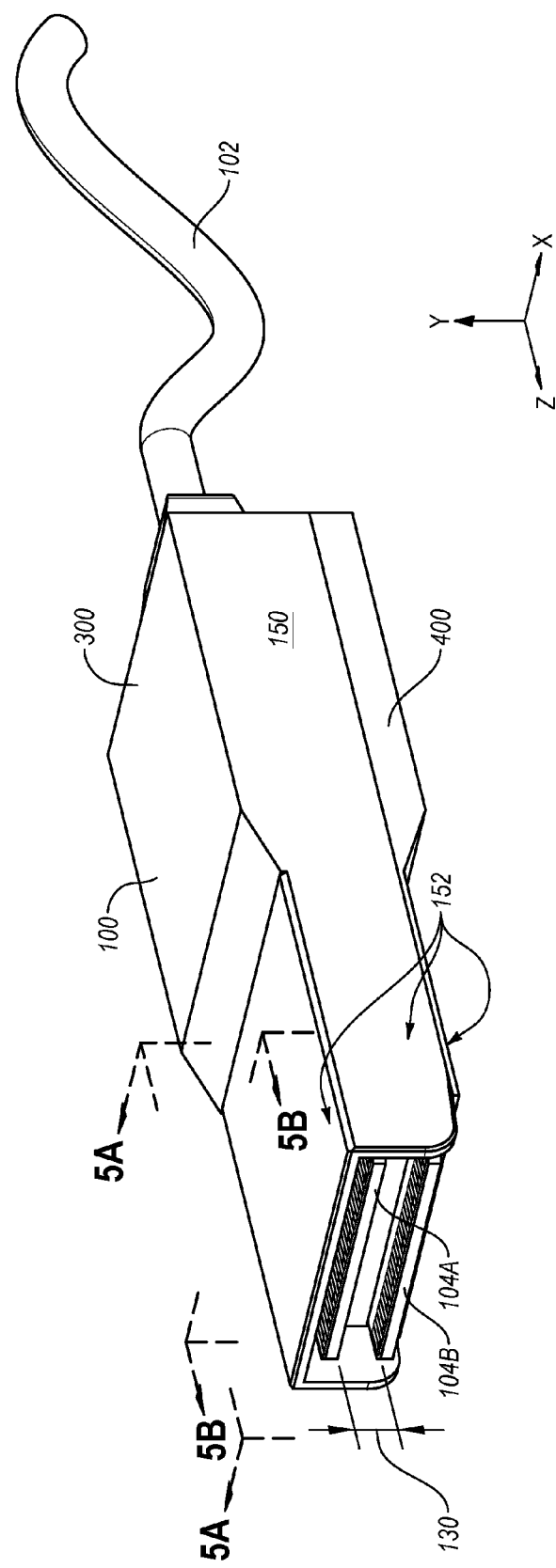
FIG. 1A illustrates an example active cable connector (connector) in which some embodiments disclosed herein may be implemented.
Figure 1B:
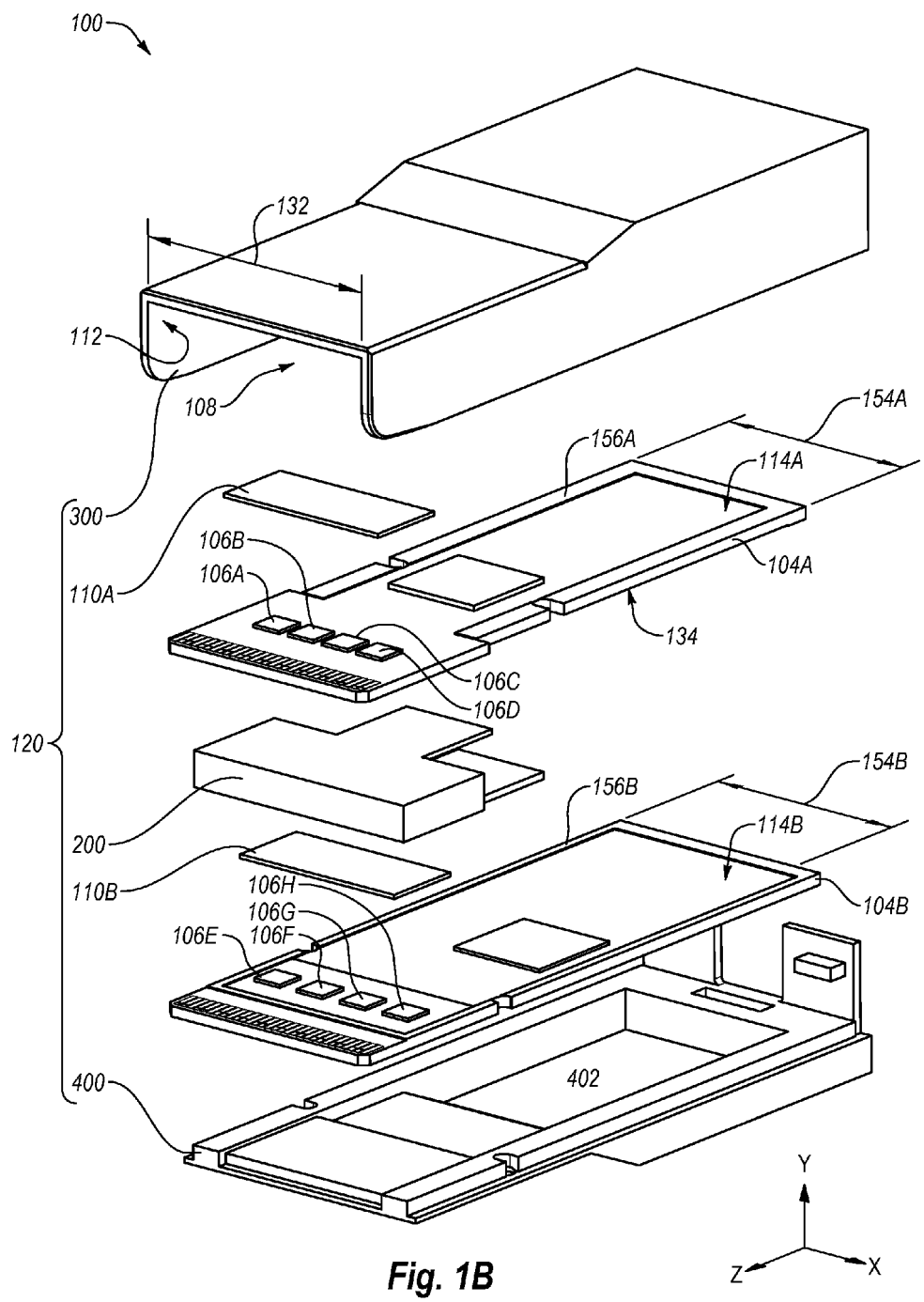
FIG. 1B illustrates an exploded view of the connector of FIG. 1A including an example thermal management system.

FIGS. 1A-1B illustrate an example active cable connector (connector) 100 in which some embodiments disclosed herein may be implemented. FIG. 1A illustrates an external view of the connector 100 coupled to an optical cable 102. FIG. 1B depicts an exploded view of the connector 100. In the depicted connector 100, data signals may be converted between optical and electrical domains. Additionally, signal processing such as re-timing, signal compensation, etc. may be performed within the connector 100. The embodiments described herein reference components and systems that may perform conversion between optical and electrical domains and signal processing within the connector 100. However, embodiments described herein are not limited to application in the connector 100. Specifically, one or more other cable connectors, active cable connectors, cable ends, communication modules, etc. with similar or dissimilar functions may employ embodiments described herein. For example, some other embodiments may be implemented in cable connectors that communicate electrical signals, communicate optical signals, or other similar connectors without limitation.

With reference to FIG. 1A, the connector 100 may be employed at an end of the optical cable 102. The optical cable 102 may include one or more optical fibers configured to communicate optical signals generated by the connector 100. Some data included in the optical signals generated by the connector 100 may originate at a host system (not shown). The host system may be configured to receive and/or secure the connector 100. For example, the host system may include a cage assembly, which may be configured according to a shape of the connector 100. For example, the connector 100 may include a top shell 300 and a bottom shell 400 (collectively, the shell). The host system may have a shape that is generally complementary to the shape of the shell or otherwise allows reception of the shell.

The host system may additionally include one or more systems that interface with systems of the connector 100 to enable communication of data signals. For example, the host system may communicate electrical signals to one or more PCBs 104A and 104B (generally, PCB 104 or PCBs 104). Optical signals representative of the electrical signals may be generated within the connector 100 and may be communicated along the optical fibers included in the optical cable 102. Additionally or alternatively, optical signals communicated along the optical cable 102 may be received by connector 100 and converted to representative electrical signals, which may be communicated to the host system via one or more of the PCBs 104.

With reference to FIG. 1B, during conversion of electrical signals to representative optical signals and/or conversion of optical signals to representative electrical signals and during signal processing, thermal energy may be generated within the connector 100. The thermal energy may damage or reduce effectiveness of components included in the connector 100 or surrounding systems if not adequately mitigated. Accordingly, the connector 100 may include a thermal management system 120. The thermal management system 120 may be configured to absorb thermal energy from one or more heat-generating components 106A-106H (generally, heat-generating component 106 or heat-generating components 106) and/or other components mounted to the PCBs 104 positioned within the connector 100 and to transfer the thermal energy to the shell of the connector 100. The thermal energy may be dissipated from the shell to a surrounding environment.

In this and other embodiments, the shell may include the top shell 300 and the bottom shell 400. The bottom shell 400 and the top shell 300 may be configured to be joined. When joined, the top shell 300 and the bottom shell 400 may define a cavity, which is generally indicated in FIG. 1B by arrow 108. The PCBs 104, the heat-generating components 106, other components mounted to the PCBs 104, and thermal management system 120 may be positioned within the cavity 108 defined by the top shell 300 and the bottom shell 400. In the depicted embodiment, the top shell 300 and the bottom shell 400 may be joined to define the cavity. In some alternative embodiments, a shell may be a combination of three or more sub-shell components (i.e., similar to the top shell 300 and/or the bottom shell 400) or may be a unitary structure.

An internal shell surface 112 of the shell may include an internal surface 302 (FIGS. 3A-3B) of the top shell 300 and an internal surface 402 of the bottom shell 400. The internal shell surface 112 may include one or more heat-transfer areas (discussed below). The heat-transfer areas may be configured to enable transfer of thermal energy from one or more of the heat-generating components 106 and/or from a component (e.g., 110A, 110B, and 200) of the thermal management system 120.

In this and other embodiments, the first PCB 104A may be positioned above the second PCB 104B. As used with reference to FIG. 1B, the term "above" indicates a greater y-coordinate in the depicted, arbitrarily defined coordinate system. The first PCB 104A may include a first subset of heat-generating components 106, which may be mounted to a first mounting surface 114A of the first PCB 104A. The second PCB 104B may include a second subset of heat-generating components 106, which may be mounted to a second mounting surface 114B of the second PCB 104B. The heat-generating components 106 may include one or more clock and data recovery (CDR) circuits, one or more other optical components, one or more signal-processing circuits, etc. For example, in some embodiments, the first subset of heat-generating components 106 and/or the second subset of heat-generating components 106 may include a row of four CDR circuits, each of which may be a 4×4 CDR circuit. Additionally, in this and other embodiments, the first PCB 104A and the second PCB 104B may be oriented such that the first mounting surface 114A and the second mounting surface 114B are facing a common direction. Specifically, in the depicted embodiment the first mounting surface 114A of the first PCB 104A is oriented such that the first mounting surface 114A faces the internal surface 302 (FIGS. 3A-3B) of the top shell 300. Additionally, the second mounting surface 114B of the second PCB 104B is oriented such that the second mounting surface 114B also faces the internal surface 302 of the top shell 300.

A first thermal pad 110A may be positioned between the first subset of heat-generating components 106 and the internal shell surface 112. The first thermal pad 110A may be configured to absorb thermal energy generated by the first subset of heat-generating components 106 and to transfer the thermal energy to a heat-transfer area of the top shell 300. The thermal energy may be dissipated to a surrounding environment from the top shell 300.

A second thermal pad 110B and a back plate 200 may be positioned above the second PCB 104B and between the first PCB 104A and the second PCB 104B. The second thermal pad 110B may also be positioned between the back plate 200 and the second subset of heat-generating components 106. The second thermal pad 110B may be configured to absorb thermal energy generated by the second subset of heat-generating components 106 and to transfer the thermal energy to the back plate 200. Additionally, the back plate 200 may be positioned with respect to the first subset of heat-generating components 106 to absorb a portion of the thermal energy generated by the first subset of heat-generating components 106. The back plate 200 may be configured to transfer the thermal energy to the top shell 300 at a heat transfer area. The thermal energy may be dissipated to the surrounding environment from the top shell 300.

In this and other embodiments, the first thermal pad 110A and the second thermal pad 110B may contact the first subset of heat-generating components 106 and the second subset of heat-generating components 106, respectively. In these embodiments, thermal energy may be transferred to the thermal pads 110 though thermal conduction at the areas in contact. Additionally or alternatively, thermal energy may be transferred to the thermal pads 110 via convection. Accordingly, in embodiments in which the thermal pads 110 contact the heat-generating components 106, thermal energy may be transferred to the thermal pads 110 both in areas of direct contact via thermal conduction and in spaces surrounding the heat-generating components 106 via convection. In embodiments in which the thermal pads 110 do not contact the thermal pads 110, thermal energy may be transferred to the thermal pads 110 primarily through convection.

The first thermal pad 110A may contact the top shell 300 at a heat transfer area and the second thermal pad 110B may contact the back plate 200. As above, embodiments in which the thermal pads 110 contact the top shell 300 or the back plate 200, transfer of thermal energy may be primarily through thermal conduction. Additionally or alternatively, transfer of thermal energy between the thermal pads 110 and the top shell 300 or the back plate 200 may occur through convection.

In some alternative embodiments, the thermal management system 120 may include no thermal pads 110, one thermal pad 110, or more than two thermal pads 110. For example, the first thermal pad 110A may be separated into multiple, smaller thermal pads that may be sized to contact a single heat-generating component 106.

In embodiments that include the thermal pads 110, the transfer of thermal energy is facilitated between the heat-generating components 106 and the shell by the thermal pads 110. Generally, the thermal pads 110 may be composed of a thermally-conductive material that may deform. Thus, the thermal pads 110 may compensate for imperfections in surfaces in which the thermal pads 110 are in contact. For instance, the internal surface 302 (FIGS. 3A-3B) of the top shell 300 and/or the first subset of heat-generating components 106 may be sloped or have multiple dimples, forge marks, etc. In embodiments without a thermal pad 110, the contact between the first subset of heat-generating components 106 and the internal surface may be reduced because of the imperfections, which may accordingly reduce thermal conduction between the internal surface 302 and the first subset of heat-generating components 106. The first thermal pad 110A may compensate for the imperfections, which may increase contact between the first subset of heat-generating components 106 and the internal surface 302.

Figure 2A:
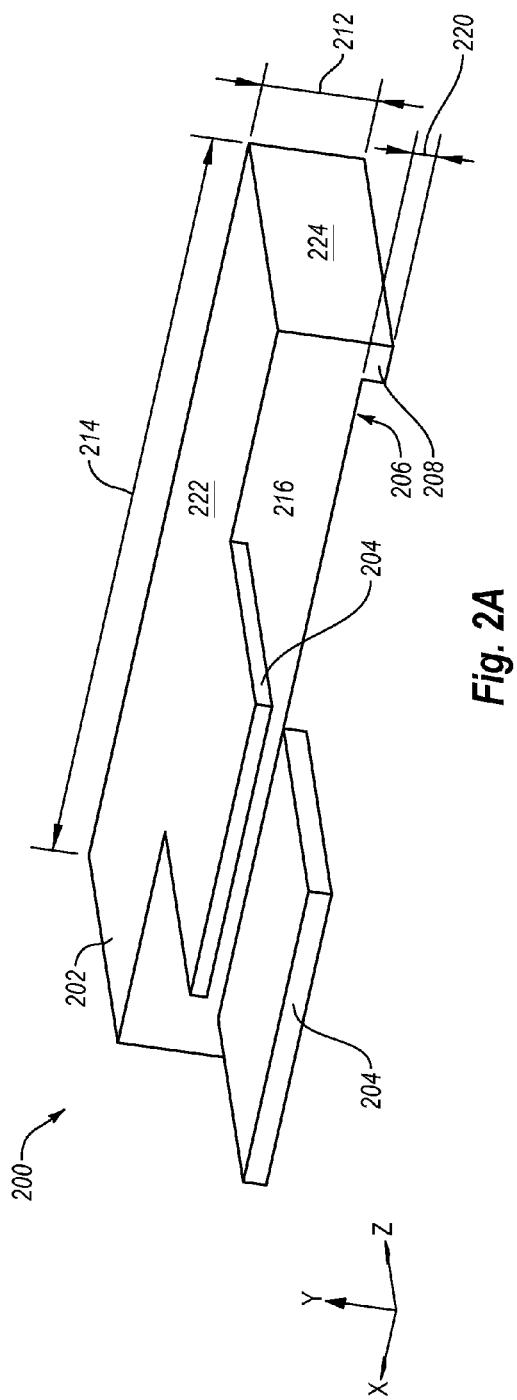
FIGS. 2A and 2B illustrate an example embodiment of a back plate that may be included in the thermal management system of FIG. 1B.
Figure 2B:
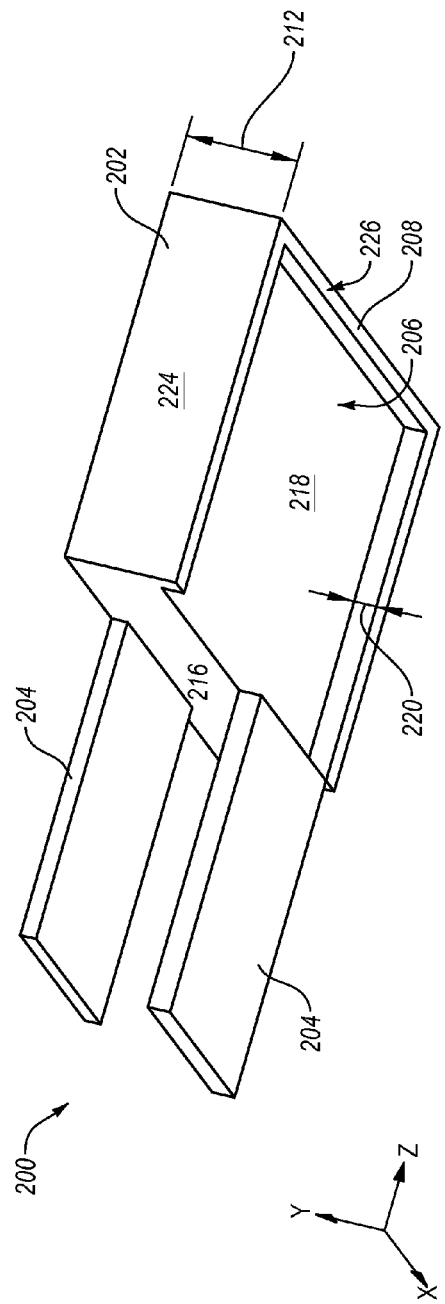

FIGS. 2A and 2B illustrate an example embodiment of the back plate 200 that may be included in the thermal management system 120 of FIG. 1B. FIG. 2A depicts a first perspective view of the back plate 200 and FIG. 2B depicts a second perspective view of the back plate 200. The back plate 200 may be positioned between PCBs such as the PCBs 104 of FIG. 1B. The back plate 200 may be configured to absorb a portion of the thermal energy generated by a heat-generating component mounted to the PCBs and to transfer the portion of the thermal energy away from the heat-generating components.

The back plate 200 may be composed of a thermally-conductive material. For example, the back plate 200 may be composed, at least partially, of copper. Alternatively or additionally, the back plate 200 may be composed of gold, silver, other metals and/or metal alloys, other thermally-conductive material(s), or a combination of materials. In some embodiments, the back plate 200 may be a single piece. Alternatively, one or more portions (e.g., 202, 204, or 208) may be manufactured independently and attached to the other portions. In these and other alternative embodiments, the portions may be composed of the same or differing materials.

The back plate 200 may include a back plate body 202. The back plate body 202 is generally a rectangular block in this and other embodiments, but may alternatively include another shape. The back plate body 202 may include one or more component supports 204 and may define a back plate recess 206.

In this and other embodiments, the component supports 204 may extend from a rear surface 216 of the back plate body 202. The component supports 204 may be configured to support a connector component. For example, the component supports 204 may be configured to support an optical component, an opto-electrical component, or an electrical component used in a connector (e.g., the connector 100 of FIG. 1) in which the back plate 200 is implemented. The component supports 204 may additionally or alternatively absorb thermal energy generated through operation of the connector component. The component supports 204 may absorb thermal energy from the connector component supported by the component supports 204 and/or may absorb thermal energy from the connector component supported by an adjacent component support 204.

In addition to the transfer of thermal energy to the back plate 200, thermal energy generated through operation of the connector components supported by the component supports 204 may be transferred to a PCB and/or to a shell of a connector in which the back plate 200 is implemented.

For example, the connector components may include a VCSEL and a lens. Operation of the VCSEL and/or the lens may generate thermal energy that may be absorbed by the component supports 204 and transferred to the back plate body 202 and away from the VCSEL and the lens. With combined reference to FIGS. 1B, 2A, and 2B, the back plate 200 may then transfer the thermal energy to the shell of the connector 100 in which the back plate 200 is implemented. In addition to the transfer of thermal energy to the back plate 200, the thermal energy generated through operation of the VCSEL and/or the lens may be transferred through one or more of the PCBs 104 and/or to the top shell 300. The transfer of thermal energy to the PCB(s) may occur through thermal conduction and convection. The transfer to the top shell 300 may occur through convection.

Referring to FIGS. 2A and 2B, in the depicted embodiment, two component supports 204 are included. However, the depicted embodiment is not meant to be limiting. In some embodiments, the back plate 200 may include a single component support 204, no component supports 204, or three or more component supports 204. The number and specific position on the back plate body 202 may be determined by the type of connector or module in which the back plate 200 is implemented. For instance, an active cable connector may include two PCBs, each having a VCSEL and a lens mounted thereto. Accordingly, the back plate 200 may include two component supports 204, one positioned near a top surface 222 and one positioned near a bottom surface 218.

As best illustrated in FIG. 2B, the back plate recess 206 may be defined on the back plate body 202. Specifically, the back plate recess 206 may be defined by a recess perimeter 208 that may extend from and partially surround the bottom surface 218. The back plate recess 206 may be configured to receive a thermal pad such as the thermal pad 110 of FIG. 1B and/or one or more heat-generating components. For example, the back plate recess 206 may include a recess height 220. The recess height 220 may be sized according to a height of the thermal pad and/or a height of a heat-generating component in contact with the thermal pad. In these and other embodiments, the recess height 220 may enable the recess perimeter 208 to contact a PCB on which the back plate 200 is positioned with the thermal pad and the heat-generating component received in the back plate recess 206.

The back plate body 202 may include a back plate height 212 and a back plate width 214 (FIG. 2A only). The back plate height 212 may be defined between the top surface 222 and a lower surface 226 of the recess perimeter 208. The plate height 212 may be sized according to a distance between two PCBs between which the back plate 200 is positioned. For example, with combined reference to FIGS. 1A, 2A, and 2B, the back plate height 212 may be substantially equal to a distance 130 between the PCBs 104.

With combined reference to FIGS. 1B, 2A, and 2B, the back plate width 214 may be defined as a distance between two side surfaces 224. In FIGS. 2A and 2B, only one of the two side surfaces 224 is visible. In some embodiments, the back plate width 214 may be sized according to a width 132 (FIG. 1B) of the cavity 108. For example, the back plate width 214 may be substantially equal to the width 132. In these and other embodiments, the side surfaces 224 may be proximate to the internal surface 302 (FIGS. 3A-3B) of the top shell 300. In some alternative embodiments, the side surfaces 224 may contact the internal surface 302 of the top shell 300.

With continued reference to FIGS. 1B, 2A, and 2B, when positioned between two PCBs 104, the top surface 222 may be positioned below the first subset of heat-generating components 106 which are mounted to the first PCB 104A. In some embodiments, the top surface 222 may contact a lower surface 134 of the first PCB 104A. Additionally, the bottom surface 218 may be positioned above the second thermal pad 110B and the two side surfaces 224 may be positioned to contact the internal surface 302 (FIGS. 3A-3B) of the top shell 300. The back plate 200 may accordingly transfer thermal energy from the second thermal pad 110B and the first subset of heat-generating components 106 to the top shell 300.

FIGS. 3A and 3B illustrate an example embodiment of the top shell 300 that may be included in the thermal management system 120 of FIG. 1B. FIG. 3A depicts a perspective view of the top shell 300 and FIG. 3B depicts a planar view of the top shell 300. The internal surface 302 of the top shell 300 is depicted in FIGS. 3A and 3B. Portions of the internal surface 302 may be heat-transfer areas 304, 306, 308, 310, 312 (collectively, heat-transfer areas 304/306/308/310/312). The heat-transfer areas 304/306/308/310/312 may generally include areas at which thermal energy is transferred to the top shell 300 by other components in a thermal management system such as the thermal management system 120 of FIG. 1B.

In this and other embodiments, the top shell 300 may include a top heat-transfer area 306. With combined reference to FIGS. 1B, 3A, and 3B, the top heat-transfer area 306 may be positioned on the top shell 300 such that thermal energy absorbed from the first subset of heat-generating components 106 may be transferred to the top shell 300. Specifically, in this and other embodiments, the top heat-transfer area 306 may be configured to contact the first thermal pad 110A. The first thermal pad 110A may accordingly transfer thermal energy to the top heat-transfer area 306 via thermal conduction.

Additionally, the top shell 300 may include one or more side heat-transfer areas 304. With combined reference to FIGS. 1B, 2B, 3A, and 3B, the side heat-transfer areas 304 may be configured to be proximate to the side surfaces 224 of the back plate 200. The side heat-transfer areas 304 may be proximate to the side surfaces 224 such that thermal energy absorbed from the first subset of heat-generating components 106 and/or the second subset of heat-generating components 106 may be transferred to the top shell 300.

The top shell 300 may also include rear back plate heat-transfer areas 310 and/or shell heat-transfer area 308. With combined reference to FIGS. 2B, 3A, and 3B, the rear back plate heat-transfer areas 310 may contact or be proximate to the rear surface 216 of the back plate 200 near the side surfaces 224. Thermal energy absorbed by the back plate 200 may be transferred to the top shell 300 via the rear back plate heat-transfer areas 310.

Referring to FIGS. 3A and 3B, generally, the top shell 300 includes a "container" shape. The top shell 300 accordingly may secure and provide heat-transfer areas 308 and 312 to PCBs positioned within the top shell 300. Specifically, in this and other embodiments, the top shell 300 may include a second PCB heat-transfer area 308. Additionally, the top shell 300 may include a first PCB heat-transfer area 312. The second PCB heat-transfer area 308 and the first PCB heat-transfer area 312 may be configured to contact and/or at least partially secure PCBs positioned within the top shell 300.

With combined reference to FIGS. 1B, 3A, and 3B, the first PCB heat-transfer area 312 may be sized to contact and secure the first PCB 104A. For example, the first PCB 104A may have a first PCB width 154A. The first PCB width 154A may correspond to one or more dimensions of the first PCB heat-transfer area 312. In this and other embodiments, the first PCB heat-transfer area 312 may contact the first PCB 104A along a portion of the perimeter 156A of the first PCB 104A. Accordingly, thermal energy generated through operation of components mounted to the first PCB 104A may be transferred to the first PCB heat-transfer area 312, which may be transferred to the top shell 300 and dissipated to a surrounding environment.

With continued reference to FIGS. 1B, 3A, and 3B, the second PCB heat-transfer area 308 may be sized to contact and secure the second PCB 104B. For example, the second PCB 104B may have a second PCB width 154B. The second PCB width 154B may correspond to one or more dimensions of the second PCB heat-transfer area 308. In this and other embodiments, the second PCB heat-transfer area 308 may contact the second PCB 104B along a portion of the perimeter 156B of the second PCB 104B. Accordingly, thermal energy generated through operation of components mounted to the second PCB 104B may be transferred to the second PCB heat-transfer area 308, which may be transferred to the top shell 300 and dissipated to a surrounding environment. In this and other embodiments, the second PCB heat-transfer area 308 may contact the second PCB 104B on the mounting surface 114B. Additionally, in some embodiments, one or more of the side heat-transfer areas 304 may enable transfer of thermal energy between the second PCB heat-transfer area 308 and the first PCB heat-transfer area 312.

In this and other embodiments, the second PCB width 154B may be greater than the first PCB width 154A. Accordingly, the first PCB heat-transfer area 312 and the second PCB heat-transfer area 308 may include a step-like structure. In some alternative embodiments, the first PCB width 154A may be greater than or equal to the second PCB width 154B. In these embodiments, the top shell 300 may include the first PCB heat-transfer area 312 and the second PCB heat-transfer area 308 may be oriented and/or shaped accordingly.

With combined reference to FIGS. 1A, 3A, and 3B, an external shell surface 150 of the shell may include one or more heat-dissipation areas 152. In some embodiments, the heat-dissipation areas 152 may be opposite one or more of the heat-transfer areas 304/306/308/310/312. The heat-dissipation areas 152 may enable dissipation of thermal energy to a surrounding environment. While heat dissipation may be localized in some embodiments to the heat-dissipation areas 152, more generally, heat may be dissipated from any area of the external shell surface 150

Figure 4:
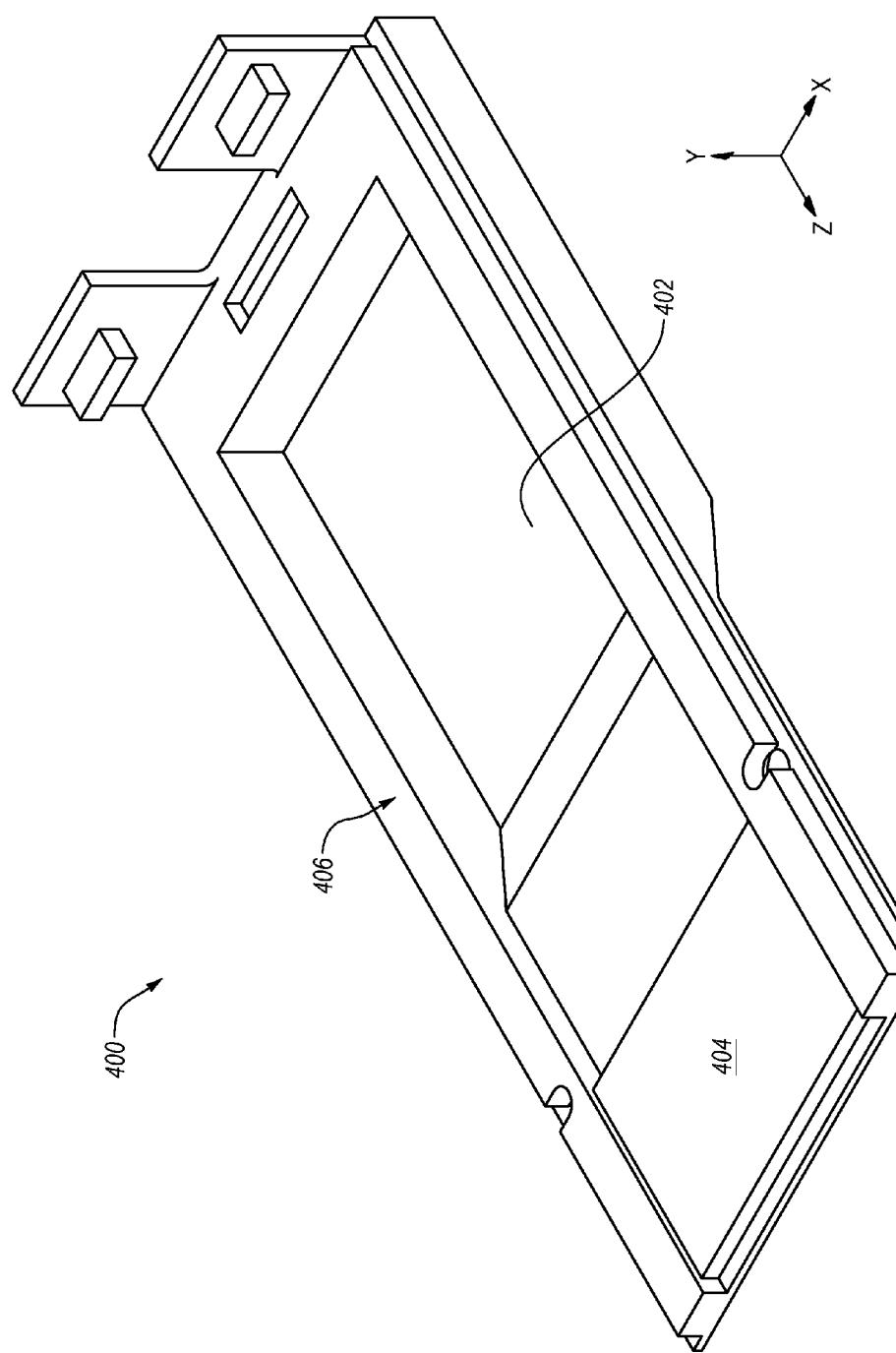
FIG. 4 illustrates an example embodiment of a bottom shell that may be included in the thermal management system of FIG. 1B.

FIG. 4 illustrates an example embodiment of the bottom shell 400 that may be included in the thermal management system 120 of FIG. 1B. In FIG. 4, the internal surface 402 is generally depicted. The internal surface 402 of the bottom shell 400 may include one or more heat-transfer areas 404 and 406 (generally, heat transfer areas 404/406). The heat-transfer areas 404/406 may be positioned on the bottom shell 400 such that thermal energy may be transferred to the bottom shell 400 at least at the heat-transfer areas 404/406.

In this and other embodiments, the bottom shell 400 includes a bottom heat-transfer area 404. With combined reference to FIGS. 1B and 4, the bottom heat-transfer area 404 may be positioned below the second subset of heat-generating components 106. Thermal energy generated by the second subset of heat-generating components 106 may be transferred to the bottom heat-transfer area 404. In some embodiments, the second PCB 104B may contact the bottom heat-transfer area 404. In particular, a portion of the second PCB 104B on which the second subset of heat-generating components 106 are mounted may contact the bottom heat-transfer area 404. Accordingly, thermal energy generated by the second subset of heat-transfer components 106 may be transferred through the second PCB 104B to the bottom heat-transfer area 404 through thermal conduction. Alternatively, the second PCB 104B may be separated from the bottom heat-transfer area 404. In these and other embodiments, thermal energy may be transferred to the bottom heat-transfer area 404 through convection.

Additionally, the bottom shell 400 may include a second PCB heat-transfer area 406. With combined reference to FIGS. 1B, 3A, 3B, and 4, the second PCB heat-transfer area 406 of the bottom shell 400 may be configured to contact the second PCB 104B opposite the second PCB heat-transfer area 308 of the top shell 300. Thermal energy generated by one or more components mounted to the second PCB 104B may be absorbed by the bottom shell 400 at the second PCB heat-transfer area 406.

Specifically in some embodiments, the second PCB heat-transfer area 406 may be size according to the second PCB width 154B. Thus, the second PCB heat-transfer area 406 may contact the second PCB 104B along a portion of the perimeter 156B of the second PCB 104B.

Additionally, thermal energy may be transferred between the bottom shell 400 and the top shell 300 when the top shell 300 is joined to the bottom shell 400. For example, thermal energy transferred to the side heat-transfer areas 304 may be transferred to the bottom shell 400 via thermal conduction through the second PCB 104B and/or contact of the top shell 300 with the internal surface 402 of the bottom shell 400.

With combined reference to FIGS. 1A and 4, like the top shell 300, the bottom shell 400 may include heat dissipation areas 152 on the external shell surface 150. The heat-dissipation areas 152 on the bottom shell 400 may enable dissipation of thermal energy to a surrounding environment. The bottom shell 400 may include a heat-dissipation area 152 opposite the bottom heat-transfer area 404 and/or along the heat-transfer area 406.

Figure 5A:
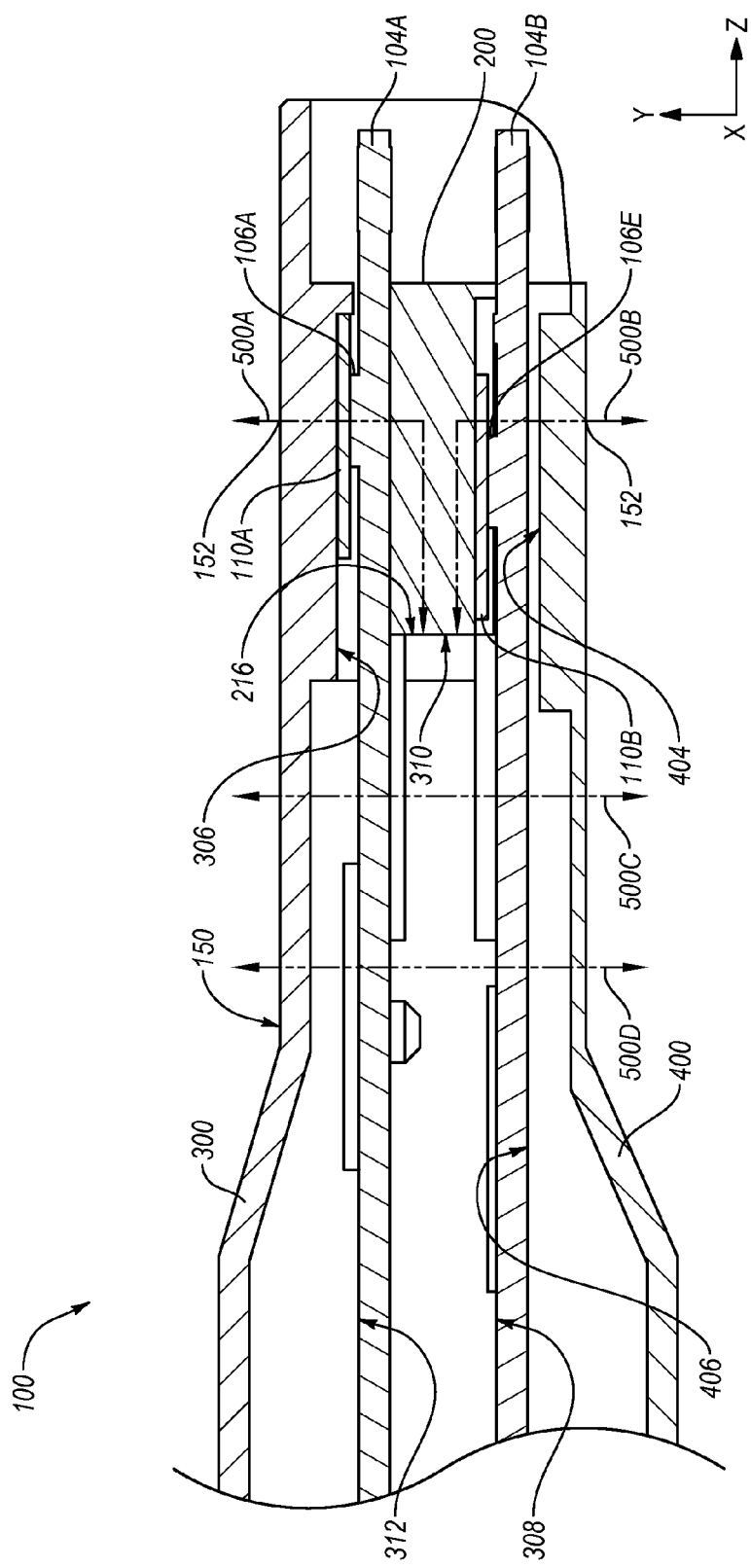
FIGS. 5A and 5B illustrate example thermal paths that may be present in the thermal management system of FIG. 1B.
Figure 5B:
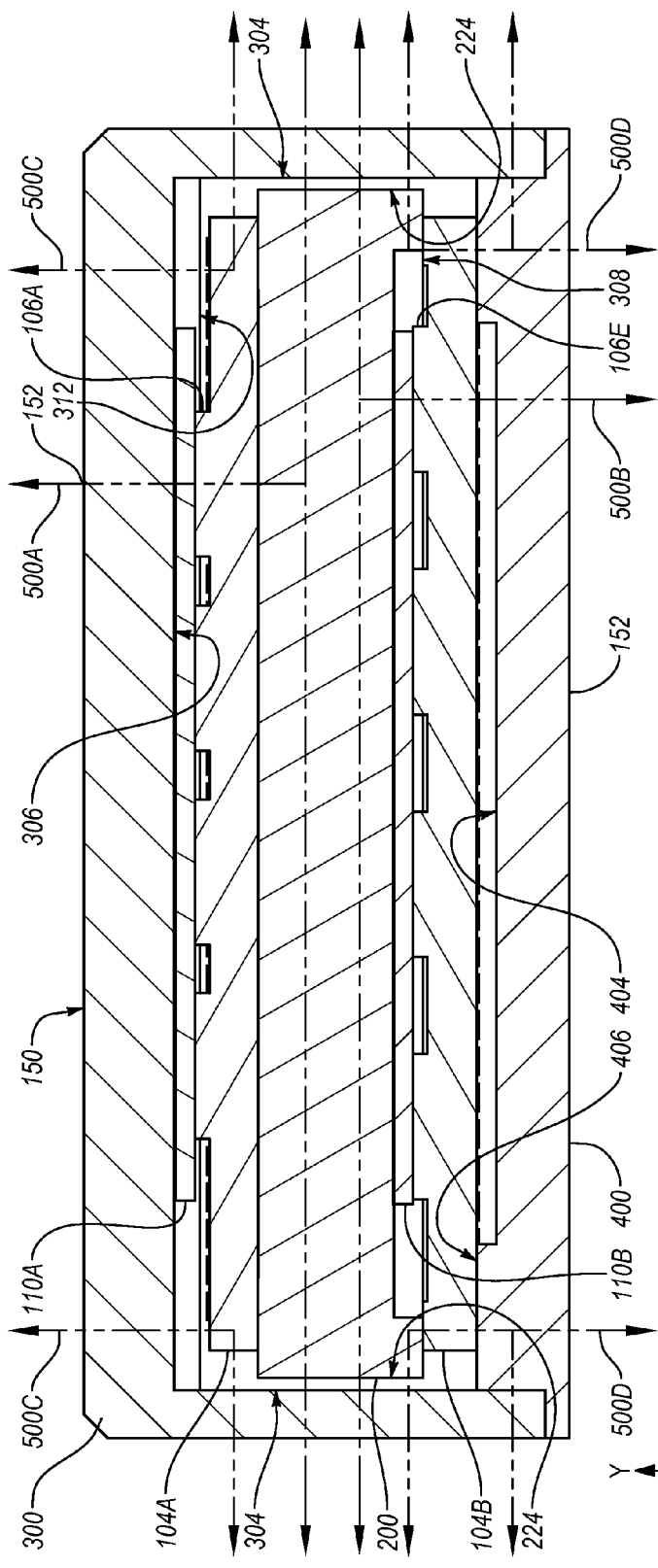

FIGS. 5A and 5B illustrate example thermal paths 500A-500D that may be present in the thermal management system 120 of FIG. 1B. FIG. 5A depicts a first sectional view of the connector 100 of FIG. 1B and FIG. 5B depicts a second sectional view of the connector 100 of FIG. 1B. The first sectional view is orthogonal to the second sectional view. Each of the thermal paths 500A-500D is represented by dashed arrows, which may indicate transfer of thermal energy in the thermal management system 120 of FIG. 1.

A first thermal path 500A represents an example transfer of thermal energy from a first heat-generating component 106A in the first subset of heat-generating components 106. A portion of the thermal energy may be transferred to the first thermal pad 110A, then to the top heat-transfer area 306. The thermal energy is absorbed by the top shell 300 and then dissipated to the surrounding environment at the heat-dissipation area 152. A second portion of the thermal energy generated by the first heat-generating component 106A may be transferred through the first PCB 104A and then to the back plate 200. The back plate 200 may transfer the second portion of the thermal energy to the top shell 300 at the rear back plate heat-transfer area 310 (FIG. 5A only) and/or to the side heat-transfer areas 304 (FIG. 5B only) via the side surfaces 224 (FIG. 5B only). The second portion of the thermal energy is then dissipated to the surrounding environment at heat-dissipation areas 152.

A second thermal path 500B represents an example transfer of thermal energy from a second heat-generating component 106E in the second subset of heat-generating components 106. A first portion of the thermal energy may be transferred to the second thermal pad 110B, and then to the back plate 200. The thermal energy may be absorbed by the back plate 200. The back plate 200 may then transfer the first portion of the thermal energy to the top shell 300 at the rear back plate heat-transfer area 310 and/or to the side heat-transfer areas 304 via the side surfaces 224. The first portion of the thermal energy may be dissipated by the top shell 300 to the surrounding environment at the heat-dissipation areas 152. A second portion of the thermal energy generated by the second heat-generating component 106E may be transferred through the second PCB 104B and then to the bottom heat-transfer area 404 of the bottom shell 400. The bottom shell 400 may dissipate the second portion of the thermal energy to the surrounding environment to the heat-dissipation areas 152. Although not shown, the PCB 104B may be in direct contact with the bottom heat-transfer area 404 and/or a thermal pad may be provided between the PCB 104B and the bottom heat-transfer area 404 to provide a thermal conduction-based thermal path from the PCB 104B to the bottom shell 400.

A third thermal path 500C represents an example transfer of thermal energy from the first PCB 104A. A first portion of the thermal energy may be transferred to the first PCB heat-transfer area 312 of the top shell 300. The thermal energy may be dissipated by the top shell 300 to the surrounding environment at the heat-dissipation areas 152.

A fourth thermal path 500D represents an example transfer of thermal energy from the second PCB 104B. A first portion of the thermal energy may be transferred to the second PCB heat-transfer area 308 of the top shell 300. In addition, a second portion of the thermal energy may be transferred to the second PCB heat-transfer area 406 of the bottom shell 400. The thermal energy may be dissipated by the top shell 300 and the bottom shell 400 to the surrounding environment at the heat-dissipation areas 152.

In some embodiments, the thermal management system 120, which may include the thermal paths 500A-500D, may dissipate about 16 watts (W) of thermal energy. In these and other embodiments, about 8 W of thermal energy may be dissipated through the top shell 300. Additionally, about 8 W of thermal energy may be dissipated through the bottom shell 400.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A thermal management system for an active cable connector, the system comprising:
 a first printed circuit board (PCB) including a first mounting surface and an opposing surface opposite the first mounting surface;
 a first heat-generating component that is mounted on the first mounting surface;
 a second PCB including a second mounting surface, wherein the first PCB and the second PCB are oriented such that the first mounting surface and the second mounting surface are facing in a common direction;
 a second heat-generating component that is mounted to the second mounting surface;
 a shell defining a cavity in which the first PCB and the second PCB are positioned, the shell including a plurality of heat-transfer areas on an internal shell surface, a first heat-transfer area of the plurality of heat transfer areas being positioned with respect to the first heat-generating component to absorb a first portion of thermal energy generated by the first heat-generating component; and
 a back plate positioned with respect to the first heat-generating component to absorb a second portion of the thermal energy generated by the first heat-generating component, positioned proximate to a second heat-transfer area of the plurality of heat-transfer areas to transfer the second portion of the thermal energy to the shell, and positioned between the second mounting surface of the second PCB and the opposing surface of the first PCB.

2. The system of claim 1, wherein the back plate is further positioned with respect to the second heat-generating component to absorb a portion of the thermal energy generated by the second heat-generating component and to transfer the portion of the thermal energy generated by the second heat-generating component to the shell.

3. The system of claim 1, wherein:
 the first PCB is sized to contact a first PCB heat-transfer area of the plurality of heat-transfer areas; and
 the second PCB is sized to contact a second PCB heat-transfer area of the plurality of heat-transfer areas.

4. The system of claim 3, wherein:
 the first PCB heat-transfer area provides a first continuous thermal path from the first PCB to the shell; and
 the second PCB heat-transfer area provides a second continuous thermal path from the second PCB to the shell.

5. The system of claim 1, further comprising a first thermal pad positioned between the first heat-generating component and the first heat-transfer area to facilitate transfer of thermal energy generated by the first heat-generating component to the shell.

6. The system of claim 5, further comprising a second thermal pad positioned between the second heat-generating component and a bottom surface of the back plate, wherein the second thermal pad is configured to facilitate transfer of thermal energy generated by the second heat-generating component to the back plate.

7. The system of claim 1, wherein the first heat-generating component and/or the second heat-generating component include a clock and data recovery (CDR) circuit.

8. The system of claim 1, wherein:
 the shell includes a top shell and a bottom shell,
 the cavity is defined when the bottom shell is joined with the top shell,
 the top shell includes a top heat-transfer area that is configured to absorb thermal energy generated by the first heat-generating component and two side heat-transfer areas positioned proximate to side surfaces of the back plate.

9. A thermal management system comprising:
 a top shell that includes a top heat-transfer area, side heat-transfer areas, a first printed circuit board (PCB) heat-transfer area, and a top shell second PCB heat-transfer area;
 a bottom shell that includes a bottom heat-transfer area and a bottom shell second PCB heat-transfer area;
 a first thermal pad that is positioned to contact the top heat-transfer area, the first thermal pad being configured to transfer thermal energy from a first subset of heat-generating components, which are mounted to a first PCB, to the top heat-transfer area;

a back plate including a top surface, two side surfaces, and a bottom surface, the back plate being positioned such that the top surface absorbs thermal energy generated by the first subset of heat-generating components, and two side surfaces positioned proximate to the side heat-transfer areas; and a second thermal pad positioned to contact the bottom surface of the back plate and configured to transfer thermal energy from a second subset of heat-generating components, which are mounted to a second PCB, to the back plate, the top shell second PCB heat-transfer area and the bottom shell second PCB heat-transfer area being configured to contact the second PCB.

10. The thermal management system of claim 9, wherein the first PCB is configured to contact the first PCB heat-transfer area.

11. The thermal management system of claim 10, wherein the back plate includes a back plate height sized according to a distance between the first PCB and the second PCB.

12. The thermal management system of claim 9, wherein:
the back plate includes a component support that extends from a back plate body, and
the component support is configured to support an optical component and to absorb thermal energy generated during operation of the optical component.

13. The thermal management system of claim 9, wherein the back plate defines a back plate recess that is configured to receive the second thermal pad.

14. The thermal management system of claim 9, wherein:
the top shell is configured to dissipate about 8 watts (W) of thermal energy generated by the first subset of heat-generating components and/or the second subset of heat-generating components; and
the bottom shell is configured to dissipate about 8 W of thermal energy generated by the first subset of heat-generating components and/or the second subset of heat-generating components.

15. An active cable connector comprising:
a shell defining a cavity, the shell including a plurality of heat-transfer areas arranged on an internal shell surface and a heat-dissipation area on an external shell surface;
a first subset of heat-generating components mounted to a first printed circuit board (PCB);
a second subset of heat-generating components mounted to a second PCB, a first mounting surface of the first PCB and a second mounting surface of the second PCB being oriented in a common direction; and
a back plate positioned between the first PCB and the second PCB, the back plate being further positioned to absorb at least a portion of thermal energy generated by the first subset of heat-generating components and the second subset of heat-generating components and to dissipate the portion of the thermal energy to one or more of the heat-transfer areas.

16. The active cable connector of claim 15, wherein:
the first PCB has a first PCB width, the second PCB has a second PCB width that is greater than the first PCB width, and
the shell includes:
a first PCB heat-transfer area that is configured to contact a portion of a perimeter of the first PCB; and
a second PCB heat-transfer area that is configured to contact a portion of a perimeter of the second PCB.

17. The active cable connector of claim 16, further comprising an optical component, wherein a portion of thermal energy generated during operation of the optical component is transferred to the first PCB heat-transfer area or the second PCB heat-transfer area.

18. The active cable connector of claim 15, further comprising:
a first thermal pad that contacts a top heat-transfer area of the plurality of heat-transfer areas and the first subset of heat-generating components; and
a second thermal pad that contacts a bottom surface of the back plate and the second subset of heat-generating components.

19. The active cable connector of claim 18, wherein the back plate includes:
a top surface that is in contact with a lower surface of the first PCB;
a back plate recess that is defined in a back plate body and configured to receive the second thermal pad; and
a recess perimeter that contacts the mounting surface of the second PCB.

* * * * *